(12) United States Patent
Leslie et al.

(10) Patent No.: US 11,862,294 B2
(45) Date of Patent: *Jan. 2, 2024

(54) MEMORY SUBSYSTEM REGISTER CLOCK DRIVER CLOCK TEEING

(71) Applicant: MICRON TECHNOLOGY, INC., Boise, ID (US)

(72) Inventors: Matthew B. Leslie, Boise, ID (US); Timothy M. Hollis, Boise, ID (US); Roy E. Greeff, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/936,048

(22) Filed: Sep. 28, 2022

(65) Prior Publication Data

US 2023/0014013 A1     Jan. 19, 2023

Related U.S. Application Data

(63) Continuation of application No. 17/360,964, filed on Jun. 28, 2021, now Pat. No. 11,468,931.

(60) Provisional application No. 63/047,417, filed on Jul. 2, 2020.

(51) Int. Cl.
*G11C 8/18* (2006.01)
*G11C 7/10* (2006.01)
*G11C 8/06* (2006.01)
*G11C 7/22* (2006.01)

(52) U.S. Cl.
CPC .............. *G11C 8/18* (2013.01); *G11C 7/1063* (2013.01); *G11C 7/222* (2013.01); *G11C 8/06* (2013.01)

(58) Field of Classification Search
CPC ........... G11C 8/18; G11C 8/06; G11C 7/1063; G11C 7/222
See application file for complete search history.

(56) References Cited

U.S. PATENT DOCUMENTS

| 6,466,074 | B2 | 10/2002 | Vakil et al. |
| 7,492,199 | B2 | 2/2009 | Barwin et al. |
| 7,915,929 | B2 | 3/2011 | Douskey et al. |
| 11,468,931 | B2 * | 10/2022 | Leslie ................. G11C 11/4076 |
| 2014/0244889 | A1 | 8/2014 | Sasson |
| 2022/0005515 | A1 | 1/2022 | Leslie et al. |

* cited by examiner

*Primary Examiner* — Son L Mai
(74) *Attorney, Agent, or Firm* — Dorsey & Whitney LLP

(57) ABSTRACT

A memory subsystem architecture that includes clock signal routing architecture to split a clock signal to support two register clock driver (RCD) devices. The clock signal routing architecture may include clock signal splitter circuit that enables contemporaneous provision of a common clock signal to the two register clock driver devices. The clock signal splitter circuit may have three legs: a first leg to receive the clock signal from an external bus, and two similar legs to route the clock signal to the RCD devices.

20 Claims, 7 Drawing Sheets

MEMORY SUBSYSTEM REGISTER CLOCK DRIVER CLOCK TEEING

CROSS REFERENCE TO RELATED APPLICATION(S)

This application is a continuation application of U.S. patent application Ser. No. 17/360,964, filed Jun. 28, 2021 and issued as U.S. Pat. No. 11,468,931 on Oct. 11, 2022, which claims the filing benefit of U.S. Provisional Application No. 63/047,417, filed Jul. 2, 2020. This application is incorporated by reference herein in its entirety and for all purposes.

BACKGROUND

High data reliability, high speed of memory access, lower power consumption and reduced chip/package size are features that are demanded from semiconductor memory. In some memory module implementations, a number of supportable memory die may be limited by signaling drivers on the module. For example, subchannel driver circuitry of a register clock driver may only have a physical capacity to drive command and address bus information to a fixed number of memory devices of a memory module. In addition, existing memory module architectures only support a single register clock driver chip. Thus, a register clock driver circuit may limit the number of supportable memory devices, which may limit the size of a memory module.

DETAILED DESCRIPTION

Figure 1:
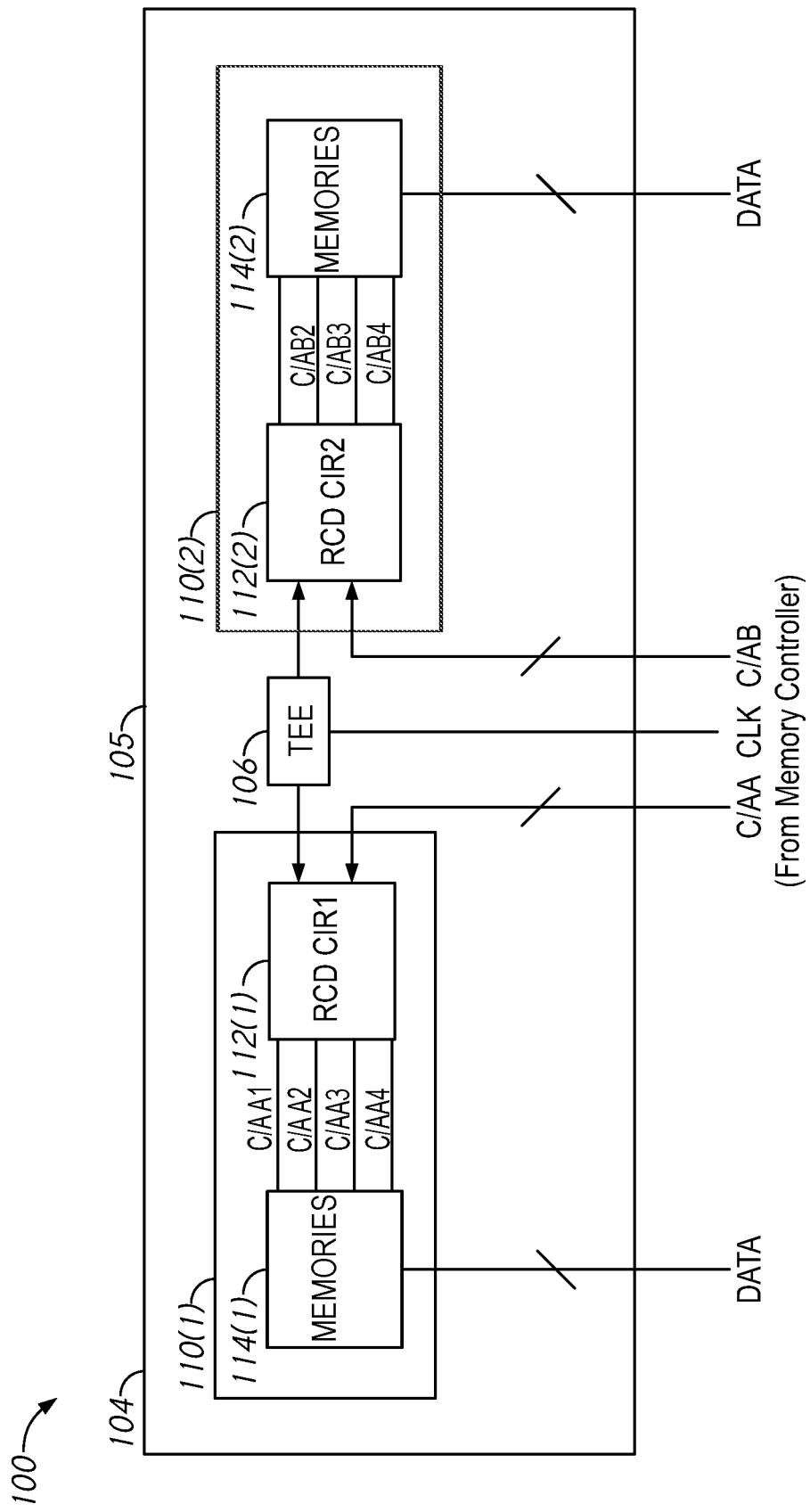
FIG. 1 is a block diagram of a memory system including a memory subsystem according to an embodiment of the present disclosure.

This disclosure describes clock signal routing architecture for a memory subsystem architecture that includes two register clock driver (RCD) devices. Implementing two RCD devices may increase the number of output drivers for signaling memories of the memory subsystem to provide an ability to support a greater number of memories as compared with implementations that use only single RCD device. However, synchronous timing between the two RCD devices is required to meet some memory subsystem architecture timing standards. In some architectures, for a single channel, a memory controller (e.g., or host, central processor unit, one or more other processor units, etc.) may provide respective command and address (C/A) information over two (or more) independent subchannels (e.g., using different respective sets of C/A signal lines) in parallel (electrically), but may only provide a single clock signal that is used to synchronize timing of each of the two (or more) subchannels such that the respective C/A information for each subchannel is provided to a respective group (e.g., a memory rank, a memory package, or some other grouping) of memories (e.g., die, devices, etc.) contemporaneously. In a single RCD device implementation where the host only provides a single clock signal, the single clock signal may be routed to the single RCD device to receive data transmitted on the two (or more) subchannels. However, in a two (or more) RCD device implementation where the host only provides a single clock signal, the single clock signal may need to be routed to each of the two (or more) RCD devices to receive the data on the two (or more) subchannels. The following describes a two RCD device implementation, but it is appreciated that the concept may be expanded to implementations with more than two RCD devices.

To enable a two RCD device implementation, the clock signal may be split (e.g., via a clock signal splitter circuit or a clock tee) such that is provided to the two RCD devices contemporaneously. The clock tee may be arranged to maintain sufficient signal integrity (SI) at clock receivers. That is, the clock signal routing architecture may be implemented with physical characteristics to maintain the synchronous timing. The physical characteristics may include impedance matching, matching trace length, adjusting trace width to avoid signal loss or reflections, etc., or any combination thereof.

In an example, the first and second RCD devices may be configured to provide first subchannel C/A information and second subchannel C/A information, respectively, to respective first and second group of memories of the memory subsystem. Because each of the first and second RCD devices operate responsive to the common clock signal, operation of the first and second RCD devices may be synchronized such that all subchannel driver circuits drive respective subchannel C/A information contemporaneously. As previously mentioned, an ability to support more than one RCD device on a memory subsystem may increase a number of output drivers, which may, correspondingly provide support for an increased number of memories on the memory subsystem as compared with single RCD device memory subsystem implementations. The clock signal routing architecture may assist the maintenance of a synchronous relationship between RCD devices in a multiple RCD device memory subsystem architectures, which may improve reliability.

FIG. 1 is a block diagram of a memory system 100 including a memory subsystem 104 according to an embodiment of the present disclosure. The memory subsystem 104 may be coupled to C/A A bus, C/A B bus, and a clock bus providing a clock signal CLK to receive command and address information form a memory controller (e.g., or a host, central processor unit, one or more other processor units or controllers, a DRAM controller, etc.) (not shown) of the memory system 100. The memory subsystem 104 may include a printed circuit board 105 that includes a memory package 110(1), a memory package 110(2), and a clock tee circuit (e.g., or clock signal splitter circuit) 106. The memory subsystem 104 may include a memory module, such as a dual, inline memory module (DIMM) (e.g., a registered DIMM, a load reduction DIMM (LRDIMM), a micro DIMM, non-volatile DIMM (NVDIMM) (e.g., including non-volatile memory and a controller (not shown)), or any other type of DIMM). In some examples, the memory subsystem 104 may include a soldered memory subsystem other than a memory module and/or a DIMM.

The printed circuit board 105 may include a first set of traces to route the first subchannel command and address information to the memory package 110(1) and a second set of traces to route the second subchannel command and address information to the memory package 110(2). In addition, the printed circuit board 105 may include a trace to route the clock signal to the clock tee circuit 106. The clock tee circuit 106 may be configured to split the CLK signal such that it is provided to the memory package 110(1) and the memory package 110(2) contemporaneously. The clock tee circuit 106 may have three legs (e.g., branches of physical routing): a first leg to receive the CLK signal from the external bus, and two similar legs to route the CLK signal to the memory package 110(1) and the memory package 110(2). The clock tee circuit 106 may be arranged to reduce likelihood of ISI at clock receivers for components of the memory package 110(1) and the memory package 110(2). That is, the architecture of the clock tee circuit 106 may be implemented with physical characteristics to maintain the synchronous timing. The physical characteristics may include impedance matching, matching trace length (e.g., length from the clock tee circuit 106 to each of the memory package 110(1) and the memory package 110(2)), selecting trace widths to avoid signal loss or reflections, use of passive resistors, etc., or any combination thereof.

The memory package 110(1) may include a register clock driver circuit 112(1) coupled to a memories 114(1) and the memory package 110(2) may include a register clock driver circuit 112(2) coupled to a memories 114(2). The register clock driver circuit 112(1) may be configured to receive first subchannel C/A information from the C/A A bus and the CLK signal and the register clock driver circuit 112(2) may be configured to receive second subchannel C/A information from the C/A B bus and the CLK signal. The first and second subchannel C/A information may correspond to C/A information for a single channel. The first subchannel C/A information and the second subchannel C/A information may include memory access commands and addresses, chip select signals, etc., corresponding to first and second subchannels, respectively. The first and/or second subchannel C/A information may also include information to configure the memory subsystem 104 and/or components of the memory package 110(1) and/or the memory package 110(2). The register clock driver circuit 112(1) may provide the first subchannel C/A information to each of C/A A1-A4 buses in parallel responsive to the CLK signal and the register clock driver circuit 112(2) may provide the second subchannel C/A information to each of C/A B1-B4 buses in parallel responsive to the CLK signal.

Each memory of the memories 114(1) may be coupled to a respective one of C/A A1-A4 buses to receive first subchannel C/A information and each memory of the memories 114(2) may be coupled to a respective one of C/A B1-B4 buses to receive second subchannel C/A information. Each memory of the memories 114(1) may also be coupled to a respective data bus to receive write data from and to provide read data to the memory controller responsive to the first subchannel C/A information. Additionally, each memory of the memories 114(2) may be coupled to a respective data bus to receive write data from and to provide read data to the memory controller responsive to the second subchannel C/A information. The memories 114(1) and/or the memories 114(2) may each include one or more memory devices, packages, and/or memory die. In some examples, the one or more memory devices or packages may each include one or more memory die stacks. The memories 114(1) and/or the memories 114(2) may each include dynamic, random-access memory (DRAM) (e.g., double data rate (DDR) 4 DRAM, DDR5 DRAM, DDR6 DRAM, etc.), in some examples.

In operation, for a given communication channel, a memory controller of the memory system 100 may contemporaneously provide respective first and second subchannel C/A information over two independent subchannels via the C/A A bus and C/A B bus, respectively, along with a single clock signal used to synchronize timing of the two subchannels to the memory subsystem 104. In some examples, the memory subsystem 104 and/or one or both of the memory package 110(1) and the memory package 110(2) may further include a control plane hub (e.g., device or chip) (not shown) to provide control plane communication between components of the memory subsystem 104 and/or one or both of the memory package 110(1) and the memory package 110(2), such as the register clock driver circuit 112(1), the register clock driver circuit 112(2), thermal sensors (not shown), power management integrated circuits (not shown), etc., or any combination thereof based on at least one of the first subchannel C/A information from the C/A A bus or the second subchannel C/A information from the C/A B bus. The control plane communications may be used to configure parameters of the components of the memory subsystem 104 and/or one or both of the memory package 110(1) and the memory package 110(2), such as voltage levels, clock timing characteristics, modes of operation, etc.

The first set of traces of the printed circuit board 105 may route the first subchannel command and address information to the memory package 110(1) and the second set of traces of the printed circuit board 105 may route the second subchannel command and address information to the memory package 110(2). In addition, the clock trace may route the clock signal to a first leg of the clock tee circuit 106. The clock tee circuit 106 may be configured to split the CLK signal such that is provided to the register clock driver circuit 112(1) and the register clock driver circuit 112(2) contemporaneously via two electrically-parallel, similar legs. The clock tee circuit 106 may be arranged to reduce likelihood of ISI at clock receivers for components of the memory package 110(1) and the memory package 110(2). That is, the architecture of the clock tee circuit 106 may be implemented with physical characteristics to maintain the synchronous timing. The physical characteristics may include impedance matching, matching trace length (e.g., length from the clock tee circuit 106 to each of the register clock driver circuit 112(1) and the register clock driver circuit 112(2)), selecting trace widths to avoid signal loss or reflections, use of passive resistors, etc., or any combination thereof. In some examples, the traces for the CLK signal may widen at the clock tee circuit 106.

The memory package 110(1) is configured to receive and respond to the first subchannel C/A information to receive and store write data at and provide read data from the memories 114(1) to the memory controller via the respective data bus and the memory package 110(2) is configured to receive and respond to the second subchannel C/A information to receive and store write data at and provide read data from the memories 114(2) to the memory controller via the respective data bus.

The register clock driver circuit 112(1) and the register clock driver circuit 112(2) may each be configured to drive the first and second subchannel C/A information received from the C/A A bus and the C/A B bus, respectively, to the C/A A1-A4 buses and the C/A B1-B4 buses, respectively, responsive to the CLK signal. Each of the register clock driver circuit 112(1) and the register clock driver circuit 112(2) may include dual (e.g., A and B), independent subchannel driver circuits that are each configured to drive the respective subchannel C/A information to a respective two of the C/A A1-A4 buses or a respective two of the C/A B1-B4 buses. For example, in response to the CLK signal, the first subchannel driver circuit of the register clock driver circuit 112(1) may provide the first subchannel C/A information to the C/A A1-A2 buses and the second subchannel driver circuit of the register clock driver circuit 112(1) may provide the first subchannel C/A information to the C/A A3-A4 buses. The subchannel driver circuits of the register clock driver circuit 112(2) may each similarly provide the second subchannel C/A information to a respective two of the C/A B1-B4 buses responsive to the CLK signal.

The memories 114(1) may be divided into four subsets, with the memories of each subset coupled to an individual one of the C/A A1-A4 buses to receive the first subchannel C/A information. Similarly, the memories 114(2) may be divided into four subsets, with the memories of each subset coupled to an individual one of the C/A B1-B4 buses to receive the second subchannel C/A information. One or more of the memories 114(1) may receive write data from or provide read data to the memory controller via the respective data bus, as well as perform other operations, responsive to the first subchannel C/A information. Similarly, one or more of the memories 114(2) may receive write data from or provide read data to the memory controller via the respective data bus, as well as perform other operations, responsive to the second subchannel C/A information.

It is appreciated that, without departing from the scope of the disclosure, the memory subsystem 104 could be scaled to include more than two memory packages, more than two RCD circuits, and/or more than two groups of memories, such as to support additional subchannels. It is also appreciated that each of the register clock driver circuit 112(1) and the register clock driver circuit 112(2) may be configured with additional driver circuits to support more than four independent C/A buses. An ability to support more than one RCD circuit on the memory subsystem 104 may increase a number of output drivers, which may, correspondingly provide support for an increased number of memories on the memory subsystem 104 as compared with single RCD device memory subsystem implementations. The clock tee circuit 106 may assist the maintenance of a synchronous relationship between the register clock driver circuit 112(1) and the register clock driver circuit 112(2), which may improve reliability.

Figure 2:
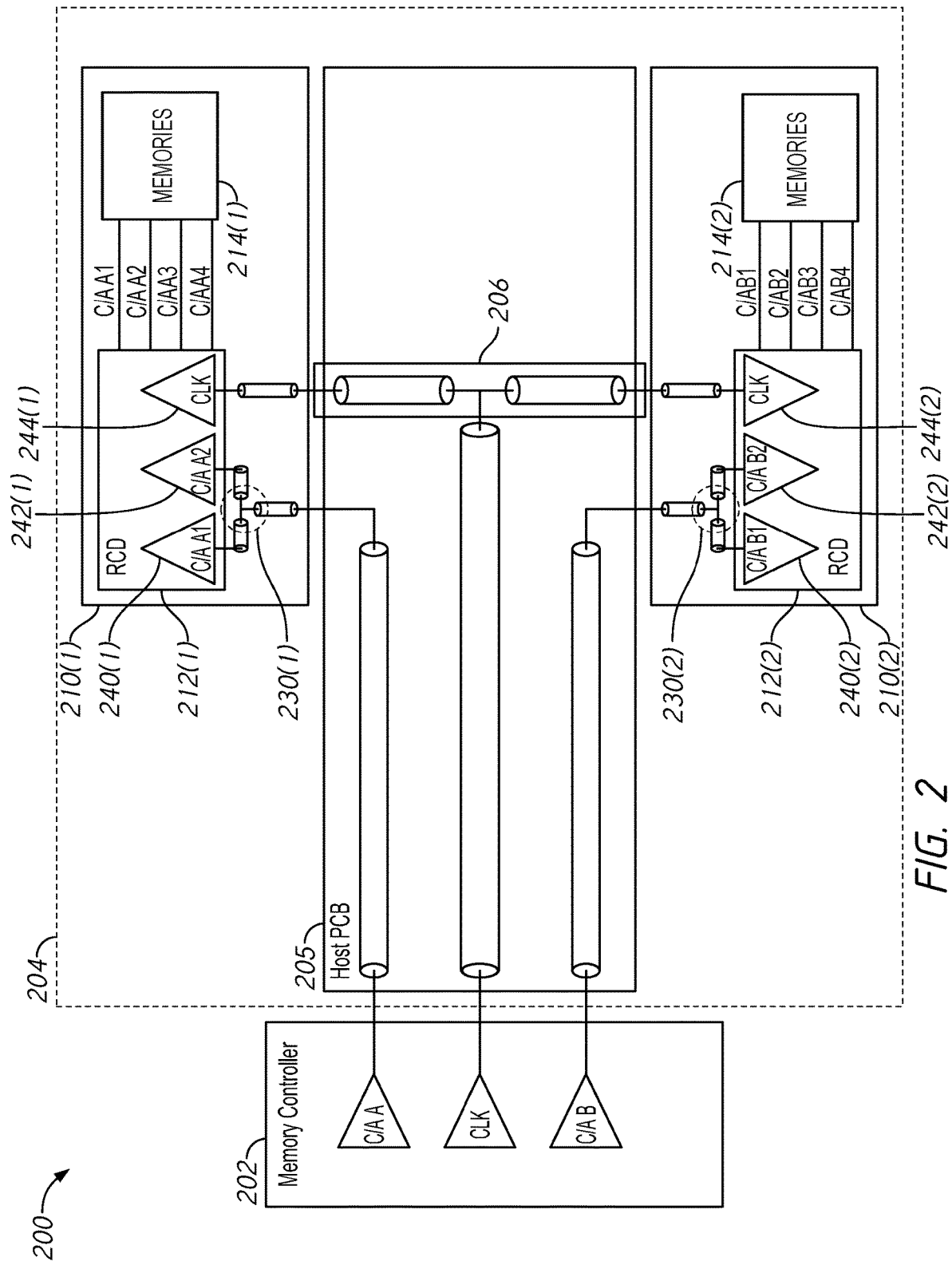
FIG. 2 is a block diagram of a memory system including a memory subsystem coupled to a memory controller according to an embodiment of the present disclosure.

FIG. 2 is a block diagram of a memory system 200 including a memory subsystem 204 coupled to a memory controller 202 according to an embodiment of the present disclosure. The memory subsystem 204 may be coupled to C/A A bus, C/A B bus, and a clock signal CLK driven by the memory controller 202. The memory controller 202 may include a host, central processor unit, one or more other processor units or controllers, a DRAM controller, etc. The memory subsystem 204 may include a printed circuit board 205 with traces to support signal lines for the C/A A bus, the C/A B bus, and the CLK signal, and may include infrastructure to support installation of a memory package 210(1) and a memory package 210(2). In some examples, the printed circuit board 205 may include a memory module printed circuit board, such as a DIMM printed circuit board. In other examples, the printed circuit board 205 includes a motherboard printed circuit board, or any other type of printed circuit board. In some examples, the memory subsystem 204 may include memory module, such as a DIMM (e.g., including a registered DIMM, a LRDIMM, a micro DIMM, a NVDIMM, or any other type of DIMM). In some examples, the memory subsystem 204 may include a soldered memory subsystem other than a memory module and/or a DIMM. The memory subsystem 104 of FIG. 1 may implement the memory subsystem 204, in some examples.

The printed circuit board 205 may include a first set of traces to route the first subchannel command and address information to the memory package 210(1) and a second set of traces to route the second subchannel command and address information to the memory package 210(2). In addition, the printed circuit board 205 may include a trace to route the clock signal to a clock tee circuit (e.g., or clock signal splitter circuit) 206. The clock tee circuit 206 may be configured to split the CLK signal such that is provided to the memory package 210(1) and the memory package 210(2) contemporaneously. The clock tee circuit 206 may have three legs (e.g., branches of physical routing): a first leg to receive the CLK signal from the external bus, and two similar legs to route the CLK signal to the memory package 210(1) and the memory package 210(2). The clock tee circuit 206 may be arranged to reduce likelihood of ISI at clock receivers for components of the memory package 210(1) and the memory package 210(2). That is, the architecture of the clock tee circuit 206 may be implemented with physical characteristics to maintain the synchronous timing. The physical characteristics may include impedance matching, matching trace length (e.g., length from the clock tee circuit 206 to each of the memory package 210(1) and the memory package 210(2)), selecting trace widths to avoid signal loss or reflections, use of passive resistors, etc., or any combination thereof.

The memory package 210(1) may include a register clock driver circuit 212(1) coupled to memories 214(1) and the memory package 210(2) may include a register clock driver circuit 212(2) coupled to memories 214(2). The register clock driver circuit 212(1) may be configured to receive first subchannel C/A information from the C/A A bus and the CLK signal and the register clock driver circuit 212(2) may be configured to receive second subchannel C/A information from the C/A B bus and the CLK signal. The first and second subchannel C/A information may correspond to C/A information for a single channel. The first subchannel C/A information and the second subchannel C/A information may include memory access commands and addresses, chip select signals, etc., corresponding to first and second subchannels, respectively. The first and/or second subchannel C/A information may also include information to configure the memory subsystem 204 and/or components of the memory package 210(1) and/or the memory package 210(2). The register clock driver circuit 212(1) may provide the first subchannel C/A information to each of C/A A1-A4 buses in parallel (e.g., contemporaneously) responsive to the CLK signal and the register clock driver circuit 212(2) may provide the second subchannel C/A information to each of C/A B1-B4 buses in parallel responsive to the CLK signal.

The register clock driver circuit 212(1) may include a first driver circuit 240(1) and a second driver circuit 242(1) that are each configured to receive the first subchannel C/A information in parallel (e.g., contemporaneously) from the C/A A bus via a 232(1) and a clock driver circuit 244(1) configured to receive the CLK signal. Responsive to the CLK signal driven from the clock driver circuit 244(1), the first driver circuit 240(1) may be configured to drive the first subchannel C/A information to the C/A A1-A2 buses and the second driver circuit 242(1) may be configured to drive the first subchannel C/A information to the C/A A3-A4 buses.

Similarly, the register clock driver circuit 212(2) may include a first driver circuit 240(2) and a second driver circuit 242(2) that are each configured to receive the second subchannel C/A information in parallel (e.g., contemporaneously) from the C/A B bus via a 232(2) and a clock driver circuit 244(2) configured to receive the CLK signal. Responsive to the CLK signal driven from the clock driver circuit 244(1), the first driver circuit 240(1) may be configured to drive the second subchannel C/A information to the C/A B1-B2 buses and the second driver circuit 242(1) may be configured to drive the second subchannel C/A information to the C/A B3-B4 buses.

Each memory of the memories 214(1) may be coupled to a respective one of C/A A1-A4 buses to receive first subchannel C/A information and each memory of the memories 214(2) may be coupled to a respective one of C/A B1-B4 buses to receive second subchannel C/A information. Each memory of the memories 214(1) may also be coupled to a respective data bus to receive write data from and to provide read data to the memory controller responsive to the first subchannel C/A information. Additionally, each memory of the memories 214(2) may be coupled to a respective data bus to receive write data from and to provide read data to the memory controller responsive to the second subchannel C/A information. The memories 214(1) and/or the memories 214(2) may each include one or more memory devices, packages, and/or memory die. In some examples, the one or more memory devices or packages may each include one or more memory die stacks. The memories 214(1) and/or the memories 214(2) may each include dynamic, random-access memory (DRAM) (e.g., double data rate (DDR) 4 DRAM, DDR5 DRAM, DDR6 DRAM, etc.), in some examples.

In operation, for a given communication channel, C/A A and C/A B drivers of the memory controller 202 may contemporaneously provide respective first and second subchannel C/A information over two independent subchannels via the C/A A bus and C/A B bus, respectively, along with a CLK driver to provide a single clock signal over a clock signal line that is used to synchronize timing of the two subchannels to the memory subsystem 204. In some examples, a logic chip on the clock tee circuit 206 and/or one or both of the memory package 210(1) and the memory package 210(2) may further include a control plane hub (e.g., device or chip) (not shown) to provide control plane communication between components of the memory subsystem 204 and/or one or both of the memory package 210(1) and the memory package 210(2), such as the register clock driver circuit 212(1), the register clock driver circuit 212(2), thermal sensors (not shown), power management integrated circuits (not shown), etc., or any combination thereof based on at least one of the first subchannel C/A information from the C/A A bus or the second subchannel C/A information from the C/A B bus. The control plane communications may be used to configure parameters of the components of the memory subsystem 204 and/or one or both of the memory package 210(1) and the memory package 210(2), such as voltage levels, clock timing characteristics, modes of operation, etc.

The first set of traces of the printed circuit board 205 may route the first subchannel command and address information to the register clock driver circuit 212(1) and the second set of traces of the printed circuit board 205 may route the second subchannel command and address information to the register clock driver circuit 212(2). In addition, the clock trace may route the clock signal to a first leg of the clock tee circuit 206. The clock tee circuit 206 may be configured to split the CLK signal such that is provided to the register clock driver circuit 212(1) and the register clock driver circuit 212(2) contemporaneously via two electrically-parallel, similar legs. The clock tee circuit 206 may be arranged to reduce likelihood of ISI at clock receivers for components of the memory package 210(1) and the memory package 210(2). That is, the architecture of the clock tee circuit 206 may be implemented with physical characteristics to maintain the synchronous timing. The physical characteristics may include impedance matching, matching trace length (e.g., length from the clock tee circuit 206 to each of the register clock driver circuit 212(1) and the register clock driver circuit 212(2)), selecting trace widths to avoid signal loss or reflections, use of passive resistors, etc., or any combination thereof. In some examples, the traces for the CLK signal may widen at the clock tee circuit 206.

The memory package 210(1) is configured to receive and respond to the first subchannel C/A information to receive and store write data at and provide read data from the memories 214(1) to the memory controller via the respective data bus and the memory package 210(2) is configured to receive and respond to the second subchannel C/A information to receive and store write data at and provide read data from the memories 214(2) to the memory controller via the respective data bus.

The register clock driver circuit 212(1) and the register clock driver circuit 212(2) may each be configured to drive the first and second subchannel C/A information received from the C/A A bus and the C/A B bus, respectively, to the C/A A1-A4 buses and the C/A B1-B4 buses, respectively, responsive to the CLK signal.

The first driver circuit 240(1) and the second driver circuit 242(1) of the register clock driver circuit 212(1) may each receive the first subchannel C/A information in parallel (e.g., contemporaneously) from the C/A A bus and the clock driver circuit 244(1) may receive the CLK signal. The C/A A bus may be split via a tee 230(1) to provide the first subchannel C/A information to each of the first driver circuit 240(1) and the second driver circuit 242(1). Responsive to the CLK signal driven from the clock driver circuit 244(1), the first driver circuit 240(1) may drive the first subchannel C/A information to the C/A A1-A2 buses and the second driver circuit 242(1) may drive the first subchannel C/A information to the C/A A3-A4 buses.

The first driver circuit 240(2) and the second driver circuit 242(2) of the register clock driver circuit 212(2) may receive the second subchannel C/A information in parallel (e.g., contemporaneously) from the C/A B bus via the 232(2) and the clock driver circuit 244(2) may receive the CLK signal. The C/A B bus may be split via a tee 230(2) to provide the first subchannel C/A information to each of the first driver circuit 240(2) and the second driver circuit 242(2). Responsive to the CLK signal driven from the clock driver circuit 244(1), the first driver circuit 240(1) may drive the second subchannel C/A information to the C/A B1-B2 buses and the second driver circuit 242(1) may drive the second subchannel C/A information to the C/A B3-B4 buses. The second driver circuit 242(1), the clock driver circuit 244(1), the second driver circuit 242(2), and the clock driver circuit 244(2) may all operation in a synchronized manner with timing based on the common CLK signal.

The memories 214(1) may be divided into four subsets, with the memories of each subset coupled to an individual one of the C/A A1-A4 buses to receive the first subchannel C/A information. Similarly, the memories 214(2) may be divided into four subsets, with the memories of each subset coupled to an individual one of the C/A B1-B4 buses to receive the second subchannel C/A information. One or more of the memories 214(1) may receive write data from or provide read data to the memory controller via the respective data bus, as well as perform other operations, responsive to the first subchannel C/A information. Similarly, one or more of the memories 214(2) may receive write data from or provide read data to the memory controller via the respective data bus, as well as perform other operations, responsive to the second subchannel C/A information.

It is appreciated that, without departing from the scope of the disclosure, the memory subsystem 204 could be scaled to include more than two memory packages, more than two RCD circuits, and/or more than two groups of memories, such as to support additional subchannels. It is also appreciated that each of the register clock driver circuit 212(1) and the register clock driver circuit 212(2) may be configured with additional driver circuits to support more than four independent C/A buses. An ability to support more than one RCD circuit on the memory subsystem 204 may increase a number of output drivers, which may, correspondingly provide support for an increased number of memories on the memory subsystem 204 as compared with single RCD device memory subsystem implementations. The clock tee circuit 206 may assist the maintenance of a synchronous relationship between the register clock driver circuit 212(1) and the register clock driver circuit 212(2), which may improve reliability.

Figure 3:
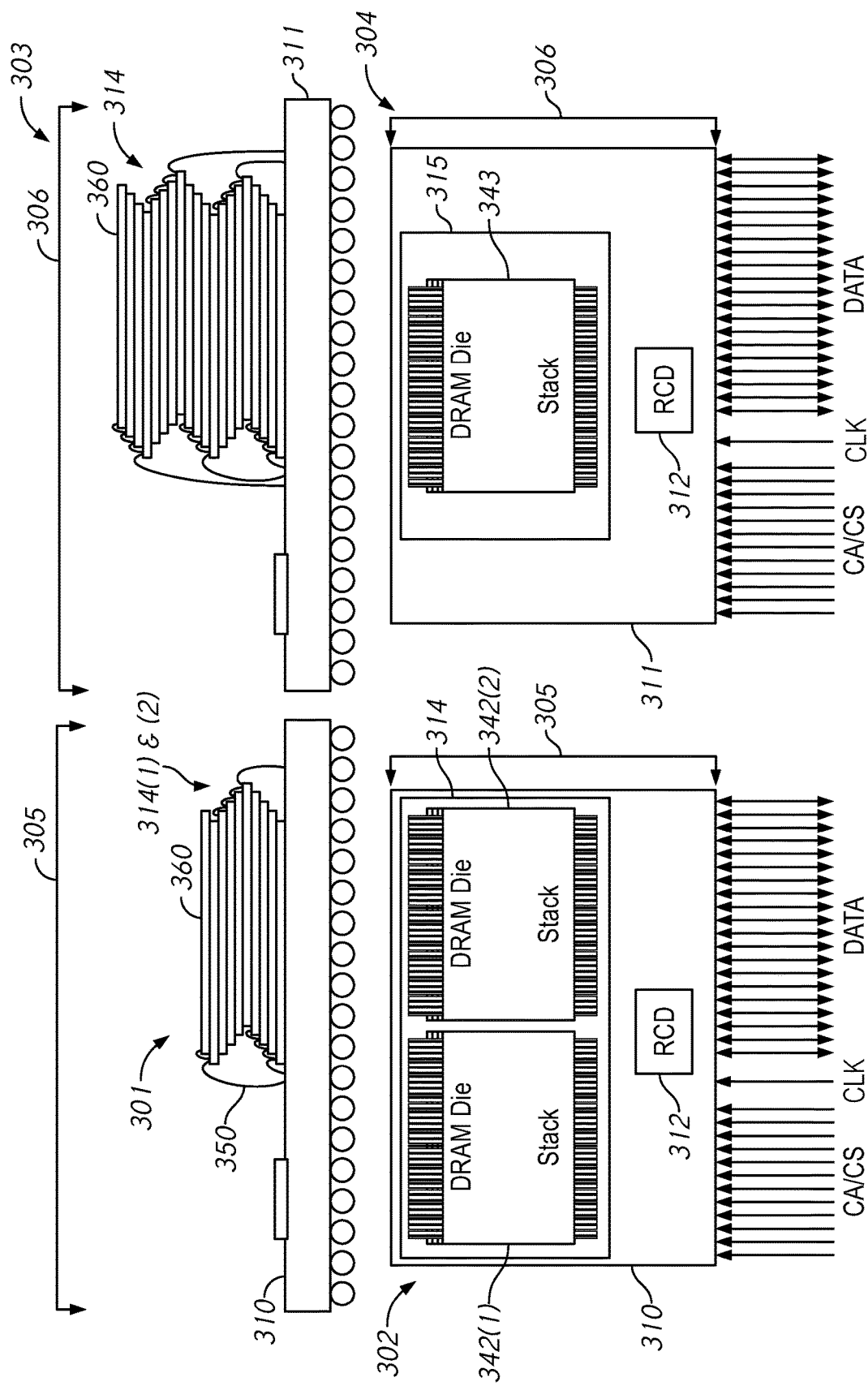
FIGS. 3A and 3B are block diagrams of a two-stack memory package and a single-stack memory package, respectively, in accordance with embodiments of the disclosure.

FIGS. 3A and 3B are block diagrams of a dual-stack memory package 310 and a single-stack memory package 311, respectively, in accordance with embodiments of the disclosure. The memory package 110(1) and/or the memory package 110(2) of FIG. 1 and/or the memory package 210(1) and/or the memory package 210(2) of FIG. 2 may implement the dual-stack memory package 310 and/or the single-stack memory package 311, in some examples.

FIG. 3A includes a side view 301 and a top (e.g., plan) view 302 of the dual-stack memory package 310. The side view 301 depicts the memory package 310 from the perspective of the side 305 (i.e., right side of the top view 302) of the memory package 310 in the FIG. 3A. The dual-stack memory package 310 may include register clock driver circuit 312 and a memory 314. The register clock driver circuit 312 may be configured to perform operations as described with reference to the register clock driver circuit 112(1) or the register clock driver circuit 112(2) of FIG. 1 and/or the register clock driver circuit 212(1) or the register clock driver circuit 212(2) of FIG. 2. The dual-stack memory package 310 may be coupled to a C/A bus (e.g., one of the C/A A1-A4 buses or one of the C/A B1-B4 buses of FIGS. 1 and/or 2) to receive respective subchannel C/A information, to a clock signal line to receive the clock signal CLK (e.g., the CLK signal of FIGS. 1 and/or 2), and to a respective data bus to receive write data and to provide read data.

The memory 314 may include a die stack 342(1) and a die stack 342(2) that each include 10 of the memory die 360 stacked in a shingle or cascade stacked arrangement (e.g., each of the memory die 360 is offset horizontally from adjacent ones of the memory die 360). Each of the memory die 360 may include a DRAM architecture, such as DDR4 DRAM, DDR5 DRAM, DDR6 DRAM, etc.), in some examples. Each of the memory die 360 of the die stack 342(1) and the die stack 342(2) may be coupled to other circuitry to perform memory access operations via respective wire bonds 350. It is appreciated that the die stack 342(1) and the die stack 342(2) may include more or fewer than 10 of the memory die 360 without departing from the scope of the disclosure. It is also appreciated that the die stack 342(1) may include a different number of the memory die 360 than the die stack 342(2), in some examples. It is also appreciated that the die stack 342(1) and/or the die stack 342(2) may be arranged to use other stacking and connection implementations, such as a 3D through-silicon via stack, without departing from the scope of the disclosure.

In some examples, the dual-stack memory package 310 may further include a control plane hub (e.g., device or chip) (not shown) to provide control plane communication between components of the dual-stack memory package 310, such as the register clock driver circuit 312, thermal sensors (not shown), power management integrated circuits (not shown), etc., or any combination thereof based on the respective subchannel C/A information from the respective C/A bus. The control plane communications may be used to configure parameters of the components of the dual-stack memory package 310, such as voltage levels, clock timing characteristics, modes of operation, etc.

FIG. 3B includes a side view 303 and a top (e.g., plan) view 304 of the single-stack memory package 311. The side view 303 depicts the memory package 311 from the perspective of the side 306 (i.e., right side of the top view 304) of the memory package 310 in the FIG. 3B. The single-stack memory package 311 may include register clock driver circuit 312 and a memory 315. The register clock driver circuit 312 may be configured to perform operations as described with reference to the register clock driver circuit 112(1) or the register clock driver circuit 112(2) of FIG. 1 and/or the register clock driver circuit 212(1) or the register clock driver circuit 212(2) of FIG. 2. The single-stack memory package 311 may be coupled to a C/A bus (e.g., one of the C/A A1-A4 buses or one of the C/A B1-B4 buses of FIGS. 1 and/or 2) to receive respective subchannel C/A information, to a clock signal line to receive the clock signal CLK (e.g., the CLK signal of FIGS. 1 and/or 2), and to a respective data bus to receive write data and to provide read data.

The memory 315 may include a die stack 343 that includes 20 of the memory die 360 stacked in a shingle or cascade stacked arrangement (e.g., each of the memory die 360 is offset horizontally from adjacent ones of the memory die 360). Each of the memory die 360 of the die stack 343 may be coupled to other circuitry to perform memory access operations via respective wire bonds 350. It is appreciated that the die stack 343 may include more or fewer than 20 of the memory die 360 without departing from the scope of the disclosure. It is also appreciated that the die stack 343 may be arranged to use other stacking and connection implementations, such as a 3D through-silicon via stack, without departing from the scope of the disclosure.

In some examples, the dual-stack memory package 310 may further include a control plane hub (e.g., device or chip) (not shown) to provide control plane communication between components of the single-stack memory package 311, such as the register clock driver circuit 312, thermal sensors (not shown), power management integrated circuits (not shown), etc., or any combination thereof based on the respective subchannel C/A information from the respective C/A bus. The control plane communications may be used to configure parameters of the components of the single-stack memory package 311, such as voltage levels, clock timing characteristics, modes of operation, etc.

Figure 4:
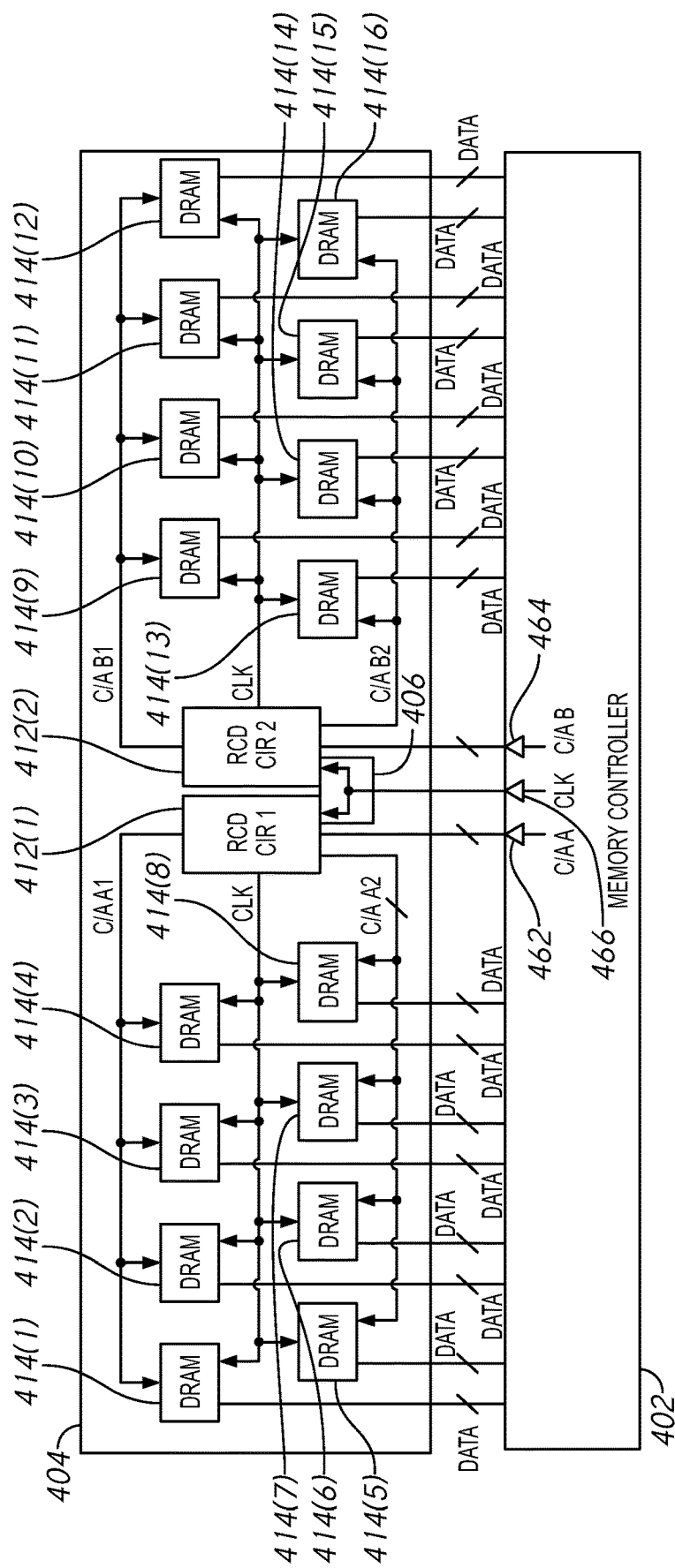
FIG. 4 is a block diagram of a memory system including a memory subsystem coupled to a memory controller according to an embodiment of the present disclosure.

FIG. 4 is a block diagram of a memory system 400 including a memory subsystem 404 coupled to a memory controller 402 according to an embodiment of the present disclosure. The memory subsystem 404 may include a memory module, such as a DIMM (e.g., a registered DIMM, a load reduction DIMM (LRDIMM), a micro DIMM, a NVDIMM, or any other type of DIMM). In some examples, the memory subsystem 404 may include a soldered memory subsystem other than a memory module and/or a DIMM. The memory subsystem 104 of FIG. 1 and/or the memory subsystem 204 of FIG. 2 may implement the memory subsystem 404, in some examples.

The memory subsystem 404 may be configured to communicate with a memory controller 402 to perform memory access operations based on a clock signal CLK, first subchannel C/A information from a C/A/A bus, second subchannel C/A information from a C/A/B bus, and/or data transferred via signals over respective data buses. In some examples, the memory controller 402 may a C/A A bus driver 462 configured to drive first subchannel C/A information from a C/A/A bus, a C/A B bus driver 464 configured to drive second subchannel C/A information from a C/A/B bus, and a clock driver 466 configured to drive the CLK signal over the clock signal line. The memory controller 402 may further include drivers and receivers (not shown) coupled to the respective data buses to provide write data and to receive read data, respectively.

The memory subsystem 404 may include memories 414(1)-(8) coupled to register clock driver circuit 412(1) and memories 414(9)-(16) coupled to register clock driver circuit 412(2). The memory subsystem 404 may include a printed circuit board configured to mount the memories 414(1)-(16), the register clock driver circuit 412(1), and the register clock driver circuit 412(2).

The printed circuit board may include a first set of traces to route the first subchannel command and address information to the register clock driver circuit 412(1) and a second set of traces to route the second subchannel command and address information to the register clock driver circuit 412(2). In addition, the printed circuit board may include a trace to route the clock signal to the clock tee circuit 406. The clock tee circuit 406 may be configured to split the CLK signal such that is provided to the register clock driver circuit 412(1) and the register clock driver circuit 412(2) contemporaneously. The clock tee circuit 406 may have three legs: a first leg to receive the CLK signal from the external bus, and two similar legs to route the CLK signal to the register clock driver circuit 412(1) and the register clock driver circuit 412(2). The clock tee circuit 406 may be arranged to reduce likelihood of ISI at clock receivers for components of the memory subsystem 404. That is, the architecture of the clock tee circuit 406 may be implemented with physical characteristics to maintain the synchronous timing. The physical characteristics may include impedance matching, matching trace length (e.g., length from the clock tee circuit 406 to each of the register clock driver circuit 412(1) and the register clock driver circuit 412(2)), selecting trace widths to avoid signal loss or reflections, use of passive resistors, etc., or any combination thereof.

The register clock driver circuit 412(1) may be configured to receive first subchannel C/A information from the C/A A bus and the CLK signal and the register clock driver circuit 412(2) may be configured to receive second subchannel C/A information from the C/A B bus and the CLK signal. The first and second subchannel C/A information may correspond to C/A information for a single channel. The first subchannel C/A information and the second subchannel C/A information may include memory access commands and addresses, chip select signals, etc., corresponding to first and second subchannels, respectively. The first and/or second subchannel C/A information may also include information to configure the memory subsystem 404 and/or components of the memory subsystem 404. The register clock driver circuit 412(1) may provide the first subchannel C/A information to each of C/A A1-A2 buses in parallel responsive to the CLK signal and the register clock driver circuit 412(2) may provide the second subchannel C/A information to each of C/A B1-B2 buses in parallel responsive to the CLK signal. It is appreciated that the memory subsystem 404 of FIG. 4 may include a dual side memory subsystem, where an opposite side (not shown) of the memory subsystem 404 includes additional memories arranged similar to the memories 414(0)-(15) and that the register clock driver circuit 412(1) and the register clock driver circuit 412(2) may provide the first and second subchannel C/A information, respectively, on additional C/A A3-A4 buses and C/A B3-B4 buses, respectively, without departing from the scope of the disclosure.

In some examples, the memories 414(1)-(16) may all be the same type of memory. In other examples, the memories 414(1)-(16) may be a mix of different types of memories. In some examples, the memories 414(1)-(16) may implement in the memories 114(1) and/or the memories 114(2) of FIG. 1, the memories 214(1) and/or the memories 214(2) of FIG. 1, the memory 314 and/or one or more of the memory die 360 of FIG. 3A, the memory 315 and/or one or more of the memory die 360 of FIG. 3B, or any combination thereof. Although the memory subsystem 404 shown in FIG. 4 having 16 memories 414(1)-(16), more or fewer memories may be used in other embodiments. In some examples, the memory subsystem 404 may include an additional memory (not shown) that is used for error correcting code (ECC) storage. Each of the memories 414(1)-(16) may include one or more memory devices, packages, and/or memory die. In some examples, the one or more memory devices or packages may each include one or more memory die stacks. The memories 414(1)-(16) may include DRAM architecture, such as DDR4 DRAM, DDR5 DRAM, DDR6 DRAM, etc.

Each of the memories 414(1)-(4) may be coupled to the C/A A1 bus and each of the memories 414(5)-(8) may be coupled to the C/A A2 bus to receive first subchannel C/A information. Each of the memories 414(9)-(12) may be coupled to the C/A B1 bus and each of the memories 414(13)-(16) may be coupled to the C/A B2 bus to receive second subchannel C/A information. Each of the memories 414(1)-(16) may also be coupled to a respective data bus to receive write data from and to provide read data to the memory controller memory controller 202 responsive to the first subchannel C/A information or the second subchannel C/A information.

In some embodiments, the memories 414(1)-(16) may be organized into different physical ranks and/or may be included on one or both sides of the memory subsystem 404. In some embodiments, there may be 4, 8, 16, or more memories per physical rank, and one or more physical ranks in the memory subsystem 404. For example, the memory subsystem 404 may include a first physical rank on a first side of the memory subsystem 404 (e.g., the 16 memories 414(1)-(16)), and a second physical rank on a back side of the memory subsystem 404 (e.g., 16 more memories on a reverse side of the memory subsystem 404).

In operation, for a given communication channel, the C/A A bus driver 462 and the C/A B bus driver 464 of the 402 may contemporaneously provide respective first and second subchannel C/A information over two independent subchannels via the C/A A bus and C/A B bus, respectively, along with a clock driver 466 to provide a single clock signal over a clock signal line that is used to synchronize timing of the two subchannels to the memory subsystem 404. In some examples, the memory subsystem 404 may further include a control plane hub (e.g., device or chip) (not shown) to provide control plane communication between components of the memory subsystem 404, such as the register clock driver circuit 412(1), the register clock driver circuit 412(2), thermal sensors (not shown), power management integrated circuits (not shown), etc., or any combination thereof based on at least one of the first subchannel C/A information from the C/A A bus or the second subchannel C/A information from the C/A B bus. The control plane communications may be used to configure parameters of the components of the memory subsystem 404, such as voltage levels, clock timing characteristics, modes of operation, etc.

The first set of traces of the printed circuit board of the memory subsystem 404 may route the first subchannel command and address information to the register clock driver circuit 412(1) and the second set of traces of the printed circuit board of the memory subsystem 404 may route the second subchannel command and address information to the register clock driver circuit 412(1). In addition, the clock trace may route the clock signal to a first set of the clock tee circuit 406. The clock tee circuit 406 may be configured to split the CLK signal such that is provided to the register clock driver circuit 412(1) and the register clock driver circuit 412(2) contemporaneously via two electrically-parallel, similar legs (e.g., branches of physical routing). The clock tee circuit 406 may be arranged to reduce likelihood of ISI at clock receivers for components of the memory subsystem 404. That is, the architecture of the clock tee circuit 406 may be implemented with physical characteristics to maintain the synchronous timing. The physical characteristics may include impedance matching, matching trace length (e.g., length from the clock tee circuit 406 to each of the register clock driver circuit 412(1) and the register clock driver circuit 412(2)), selecting trace widths to avoid signal loss or reflections, use of passive resistors, etc., or any combination thereof. In some examples, the traces for the CLK signal may widen at the clock tee circuit 406.

The register clock driver circuit 412(1) and the register clock driver circuit 412(2) may each be configured to drive the first and second subchannel C/A information received from the C/A A bus and the C/A B bus, respectively, to the C/A A1-A2 buses and the C/A B1-B2 buses, respectively, responsive to the CLK signal.

Each of the memories 414(1)-(4) may receive the first subchannel C/A information via the C/A A1 bus and each of the memories 414(5)-(8) may receive the first subchannel C/A information via the C/A A2 bus. One or more of the memories 414(1)-(8) may perform memory access operations responsive to the first subchannel C/A information to receive data from and provide data to the respective data buses in communication with the memory controller 402.

Each of the memories 414(9)-(12) may receive the second subchannel C/A information via the C/A B1 bus and each of the memories 414(13)-(16) may receive the second subchannel C/A information via the C/A B2 bus. One or more of the memories 414(9)-(16) may perform memory access operations responsive to the second subchannel C/A information to receive data from and provide data to the respective data buses in communication with the memory controller 402.

It is appreciated that, without departing from the scope of the disclosure, the memory subsystem 404 could be scaled to include more than 16 (or 32) memories, more than two register clock driver circuits, and/or more than two groups of memories, such as to support additional subchannels. It is also appreciated that each of the register clock driver circuit 412(1) and the register clock driver circuit 412(2) may be configured with additional driver circuits to support more than four independent C/A buses. An ability to support more than one register clock driver circuit on the memory subsystem 404 may increase a number of output drivers, which may, correspondingly provide support for an increased number of memories on the memory subsystem 404 as compared with single RCD device memory subsystem implementations. The clock tee circuit 406 may assist the maintenance of a synchronous relationship between the register clock driver circuit 412(1) and the register clock driver circuit 412(2), which may improve reliability.

Figure 5:
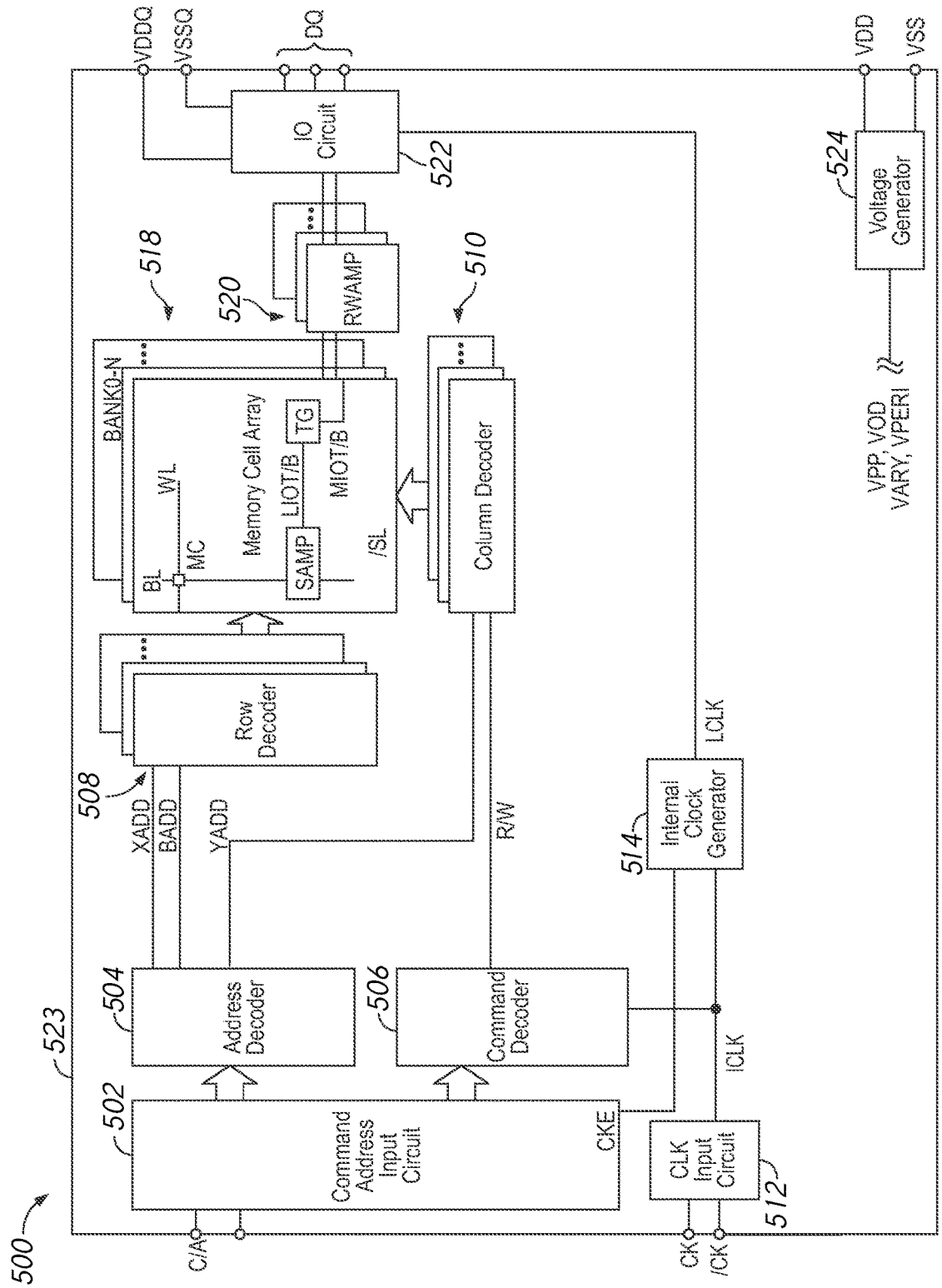
FIG. 5 is a block diagram of a semiconductor device according to an embodiment of the present disclosure.

FIG. 5 is a block diagram of a semiconductor device 500 according to at least one embodiment of the disclosure. The semiconductor device 500 may be a semiconductor memory device, such as DRAM device (e.g., double data rate (DDR) 4 DRAM, DDR5 DRAM, DDR6 DRAM, etc.) integrated on a single semiconductor chip. The example device 500 of FIG. 5 may include a memory package such as the stack of memory dies positioned on a substrate 523, which may function as (and may be referred to) as an interface. Although certain components are shown in the memory dies of the stack of memory dies, and certain components on the substrate 523, other arrangement of the components of the device 500 between the stack of memory dies and the substrate 523 are possible in other example embodiments. In some embodiments, the device 500 may include multiple stacks of memory dies. In other embodiments, the stack of memory dies may include a single memory die. The memory package 110(1) and/or the memory package 110(2) of FIG. 1, the memory package 210(1) and/or the memory package 210(2) of FIG. 2, the dual-stack memory package 310 and/or either or both of the die stack 342(1) and the die stack 342(2) of FIG. 3A, the single-stack memory package 311 and/or the die stack 343 of FIG. 3B, any of the memories register clock driver circuit 412(1)-(16) of FIG. 4, or any combination thereof, may implement the semiconductor device 500, in some examples.

For brevity and clarity of illustration, only the components of one memory die in the stack of memory dies are shown in FIG. 5. Generally, the different memory dies of the stack of memory dies may each have similar components to each other. In some embodiments, each memory die of the stack of memory dies may be physically identical to each other. The substrate 523 may act as an interface, and may send and receive information (e.g., data, commands) to and from the outside, while the memory dies in the stack of memory dies communicate with components of the substrate. As described herein, commands and other signals sent by the substrate 523 may be sent to all memory dies in the stack of memory dies or may be separately addressed to individual memory dies of the stack of memory dies.

The semiconductor device 500 includes a memory array 518. The memory array 518 may be positioned in a die of the stack of memory dies. The memory array 518 is shown as including a plurality of memory banks. In the embodiment of FIG. 5, the memory array 518 is shown as including N+1 memory banks BANK0-N, where N is any integer value, such as 2, 4, 8, 16, 32, etc. Each of the memory banks BANK0-N may include a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 508 and the selection of the bit lines BL and /BL is performed by a column decoder 510. The row and column decoders 508 and 510 may also be positioned in the memory dies of the stack of memory dies. In the embodiment of FIG. 5, the row decoder 508 includes a respective row decoder for each memory bank and the column decoder 510 includes a respective column decoder for each memory bank. The bit lines BL and /BL are coupled to a respective sense amplifier (SAMP). Read data from the bit line BL or /BL is amplified by the sense amplifier SAMP, and transferred to read/write amplifiers 520 over complementary local data lines (LIOT/B), transfer gate (TG), and complementary main data lines (MIOT/B). Conversely, write data outputted from the read/write amplifiers 520 is transferred to the sense amplifier SAMP over the complementary main data lines MIOT/B, the transfer gate TG, and the complementary local data lines LIOT/B, and written in the memory cell MC coupled to the bit line BL or /BL.

The semiconductor device 500 may employ a plurality of external terminals that include command and address (C/A) terminals coupled to a command and address bus to receive commands and addresses, and a CS signal, clock terminals to receive clocks CK and /CK, data terminals DQ to receive and provide data (e.g., via a multi-channel data bus), and power supply terminals to receive power supply potentials VDD, VSS, VDDQ, and VSSQ. The external terminals may be positioned on the substrate 523.

The clock terminals are supplied with external clocks CK and /CK that are provided to an input circuit 514. The external clocks may be complementary. The input circuit 514 generates an internal clock ICLK based on the CK and /CK clocks. The ICLK clock is provided to the command decoder 510 and to an internal clock generator 512. The internal clock generator 512 provides various internal clocks LCLK based on the ICLK clock. The LCLK clocks may be used for timing operation of various internal circuits. The internal data clocks LCLK are provided to the input/output circuit 522 to time operation of circuits included in the input/output circuit 522, for example, to data receivers to time the receipt of write data.

The C/A terminals may be supplied with memory addresses. The memory addresses supplied to the C/A terminals are transferred, via a command/address input circuit 502, to an address decoder 504. The address decoder 504 receives the address and supplies a decoded row address XADD to the row decoder 508 and supplies a decoded column address YADD to the column decoder 510. The address decoder 504 may also supply a decoded bank address BADD, which may indicate the bank of the memory array 518 containing the decoded row address XADD and column address YADD. In some embodiments, the address decoder 504 may also indicate a particular memory die of the stack of memory dies for activation. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 506 via the command/address input circuit 502. The command decoder 506 includes circuits to decode the internal command signals to generate various internal signals and commands for performing operations. For example, the command decoder 506 may provide a row command signal to select a word line and a column command signal to select a bit line.

The semiconductor device 500 may receive an access command which is a read command. When a read command is received, and a bank address, a row address and a column address (and optional die address) are timely supplied with the read command, read data is read from memory cells in the memory array 518 corresponding to the row address and column address. The read command is received by the command decoder 506, which provides internal commands so that read data from the memory array 518 is provided to the read/write amplifiers 520. The read data is output to outside from the data terminals DQ via the input/output circuit 522.

The semiconductor device 500 may receive an access command which is a write command. When the write command is received, and a bank address, a row address and a column address (and optional die address) are timely supplied with the write command, write data supplied to the data terminals DQ is written to a memory cells in the memory array 518 corresponding to the row address and column address. The write command is received by the command decoder 506, which provides internal commands so that the write data is received by data receivers in the input/output circuit 522. Write clocks may also be provided to the external clock terminals for timing the receipt of the write data by the data receivers of the input/output circuit 522. The write data is supplied via the input/output circuit 522 to the read/write amplifiers 520, and by the read/write amplifiers 520 to the memory array 518 to be written into the memory cell MC.

The power supply terminals are supplied with power supply potentials VDD and VSS. The power supply potentials VDD and VSS are supplied to an internal voltage generator circuit 524. The internal voltage generator circuit 524 generates various internal potentials VPP, VOD, VARY, VPERI, and the like based on the power supply potentials VDD and VSS supplied to the power supply terminals. The internal potential VPP is mainly used in the row decoder 508, the internal potentials VOD and VARY are mainly used in the sense amplifiers SAMP included in the memory array 518, and the internal potential VPERI is used in many peripheral circuit blocks.

The power supply terminals are also supplied with power supply potentials VDDQ and VSSQ. The power supply potentials VDDQ and VSSQ are supplied to the input/output circuit 522. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 522 so that power supply noise generated by the input/output circuit 522 does not propagate to the other circuit blocks.

Figure 6:
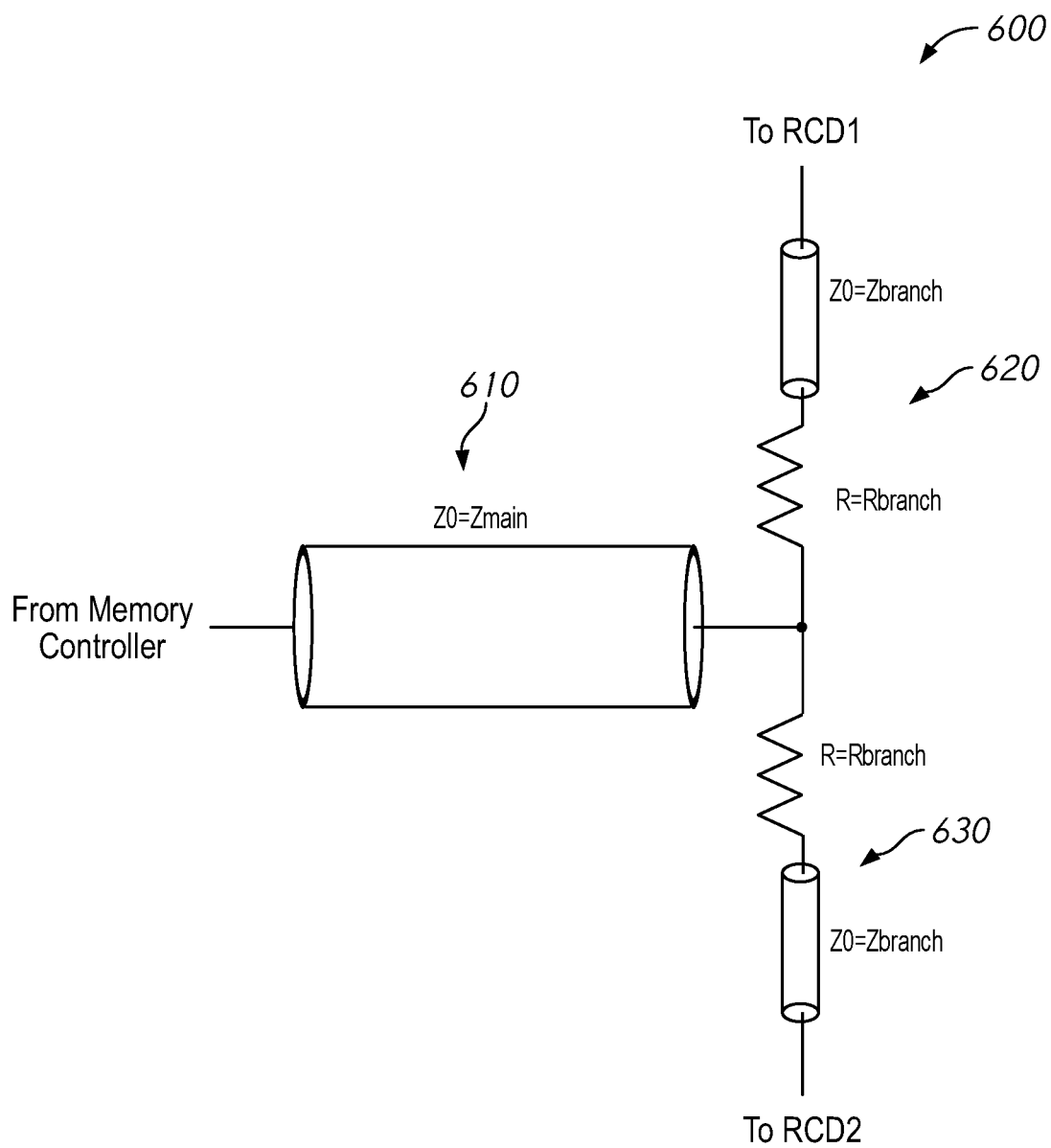
FIG. 6 is a schematic diagram of an exemplary clock tee circuit according to an embodiment of the present disclosure.

FIG. 6 is a schematic diagram of an exemplary clock tee circuit (e.g., or clock signal splitter circuit) 600 according to an embodiment of the present disclosure. The clock tee circuit 106 of FIG. 1, the clock tee circuit 206 of FIG. 2, the clock tee circuit 406 of FIG. 4, or any combination thereof, may implement the clock tee circuit 600. The clock tee circuit 600 may include three legs (e.g., branches of physical routing): a first leg 610 configured to contemporaneously route a clock signal from a memory controller to a second leg 620 coupled to a first respective register clock driver circuit and a third leg 630 coupled to a second respective register clock driver circuit. The first leg 610 may include a first ZO impedance Zmain. The second leg 620 may include a second ZO impedance Zbranch coupled in series with a resistor having a first R resistance Rbranch. The third leg 630 may include a third ZO impedance Zbranch coupled in series with a resistor having a second R resistance Rbranch. In some examples, the first leg 610 may be wider than the second leg 620 and the third leg 630. In some examples, the Rbranch resistances of the first and second resistors of the second leg 620 and the third leg 630, respectively, may be selected to impedance match the first leg 610 in combination with the second leg 620 and the third leg 620. In some examples, the Zmain impedance may be equal to half of a sum of the Rbranch resistance and the Zbranch impedance. The impedance and resistance values of the first leg 610, the second leg 620, and the third leg 630 may be controlled by loads on the connecting devices, materials uses to construct each leg, leg widths, etc., or any combination thereof. Other relative impedances may be implemented without departing from the scope of the disclosure.

Figure 7:
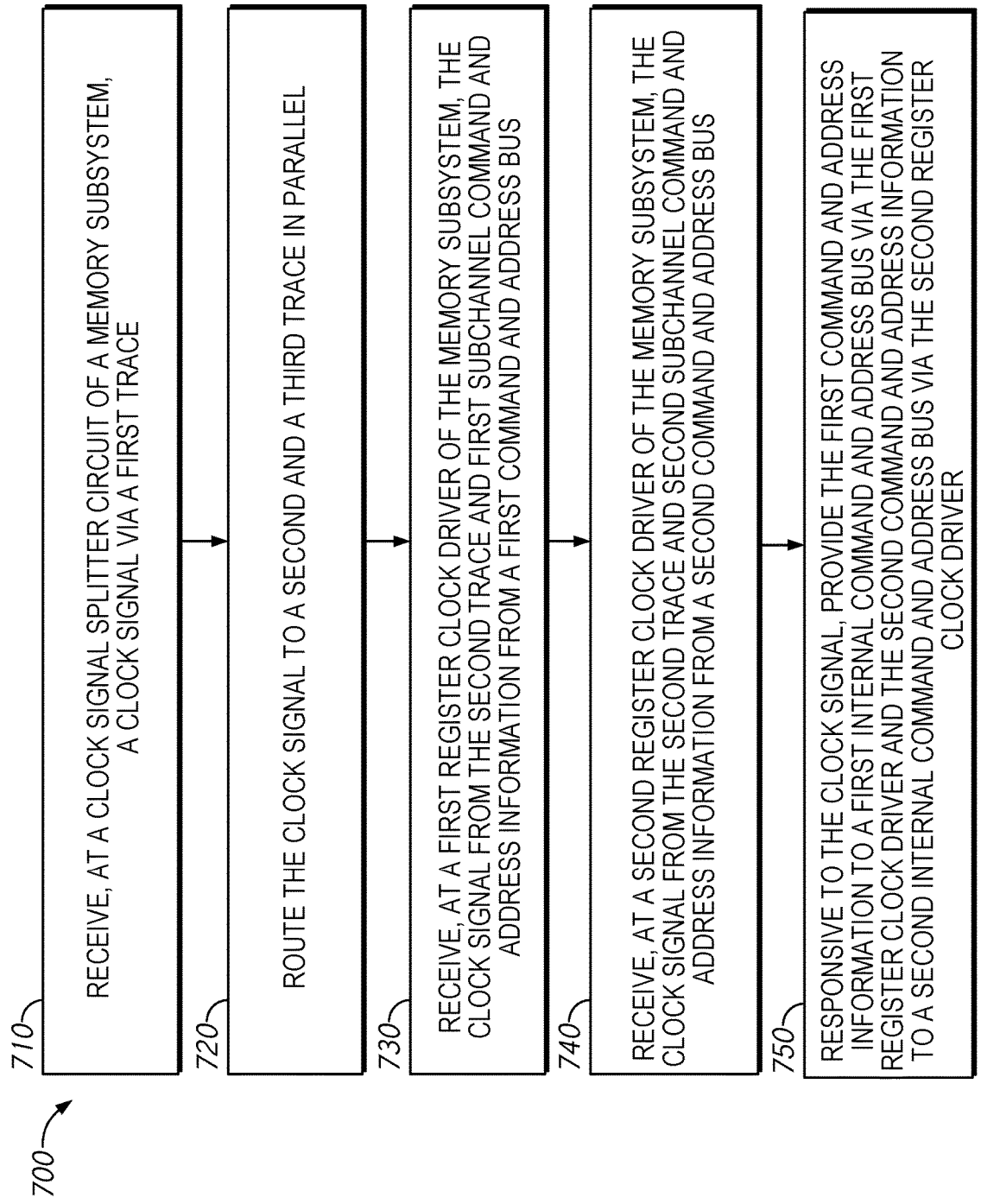
FIG. 7 is a flow diagram of a method for dual register clock driver loading of a memory subsystem using a clock tee according to an embodiment of the present disclosure.

FIG. 7 is a flow diagram of a method 700 for dual register clock driver loading of a memory subsystem using a clock tee according to an embodiment of the present disclosure. The method 700 may be performed, at least in part, by the memory subsystem 104 of FIG. 1, the memory subsystem 204 of FIG. 2, the memory subsystem 404 of FIG. 4, or any combination thereof.

The method 700 may include receiving, at a clock signal splitter circuit of a memory subsystem, a clock signal via a first trace, at 710. The method 700 may include routing the clock signal to a second and a third trace in parallel (electrically), at 720. The clock signal splitter circuit may include the clock tee circuit 106 of FIG. 1, the clock tee circuit 206 of FIG. 2, the clock tee circuit 406 of FIG. 4, the clock tee circuit 600 of FIG. 6, or any combination thereof. The clock signal may include the CLK signal of FIG. 1, the CLK signal of FIG. 2, the CLK signal of FIG. 4, or any combination thereof. In some examples, the method 700 may further include receiving the clock signal at a first leg of the clock signal splitter circuit, wherein the first leg is coupled to a first impedance; and providing the clock signal to a second leg and a third leg of the clock signal splitter circuit in response to receipt via the first leg, wherein each of the second and third legs are coupled to a respective second impedance that is different than the first impedance. The first impedance and the respective second impedances may include the first impedance 610 and the second impedance 620 and the third impedance 630 of FIG. 6, in some examples.

The method 700 may include receiving, at a first register clock driver of the memory subsystem, the clock signal from the second trace and first subchannel command and address information from a first command and address bus, at 730. The method 700 may include receiving, at a second register clock driver of the memory subsystem, the clock signal from the second trace and second subchannel command and address information from a second command and address bus, at 740. The first and/or second register clock drivers may include the register clock driver circuit 112(1) and/or the register clock driver circuit 112(2) of FIG. 1, the register clock driver circuit 112(1) and/or the register clock driver circuit 112(2) of FIG. 1, the register clock driver circuit 312 of FIGS. 3A and 3B, the register clock driver circuit 412(1) and/or the register clock driver circuit 412(2) of FIG. 4, or any combination thereof. The first and second command and address buses may include the C/A A and/or the C/A B buses of FIG. 1, the C/A A and/or the C/A B buses of FIG. 2, the C/A bus of FIGS. 3A and 3B, the C/A A and/or the C/A B buses of FIG. 4, or any combination thereof.

The method 700 may include, responsive to the clock signal, providing the first command and address information to a first internal command and address bus via the first register clock driver and the second command and address information to a second internal command and address bus via the second register clock driver, at 750. The first internal command and address bus may include any of the C/A A1-A4 buses of FIG. 1, the C/A A1-A4 buses of FIG. 2, the C/A bus of FIGS. 3A and 3B, the C/A A1-A2 (and A3-A4—not shown) of FIG. 4, or any combination thereof. The second internal command and address bus may include any of the C/A B1-B4 buses of FIG. 1, the C/A B1-B4 buses of FIG. 2, the C/A bus of FIGS. 3A and 3B, the C/A B1-B2 (and B3-B4—not shown) of FIG. 4, or any combination thereof. In some examples, provision of the first subchannel command and address information to the first internal command and address bus is contemporaneous with provision of the subchannel command and address information to the second internal command and address bus.

In some examples, the method 700 may further include performing a first memory access operation at one of a first group of memories of the memory subsystem responsive to the first subchannel command and address information provided to the first internal command and address bus, and performing a second memory access operation at one of a second group of memories of the memory subsystem responsive to the second subchannel command and address information provided to the second internal command and address bus. The first group of memories and/or the second group of memories may include the memories 114(1) and/or the memories 114(2) of FIG. 1, the memories 114(1) and/or the memories 114(2) of FIG. 1, the memory 314 of FIG. 3A, the memory 315 of FIG. 3B, the memories 414(1)-(16) of FIG. 4, or any combination thereof. In some examples, the first and/or the second plurality of internal command and address buses includes more than two buses. The first and second groups of memories include DRAM, (e.g., DDR4, DDR5, DDR6, etc.).

Of course, it is to be appreciated that any one of the examples, embodiments or processes described herein may be combined with one or more other examples, embodiments and/or processes or be separated and/or performed amongst separate devices or device portions in accordance with the present systems, devices and methods.

The foregoing description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

The invention claimed is:

1. An apparatus comprising:
a clock signal splitter circuit configured to receive a clock signal via a first trace and to route the clock signal to a second trace and a third trace that is connected in parallel with the second trace;
a first register clock driver coupled to the clock signal splitter circuit, the first register clock driver configured to receive the clock signal from the second trace; and
a second register clock driver coupled to the clock signal splitter circuit, the second register clock driver configured to receive the clock signal from the third trace.

2. The apparatus of claim 1, wherein the first register clock driver is further configured to receive first subchannel command and address information from a first command and address bus, and wherein the second register clock driver is further configured to receive second subchannel command and address information from a second command and address bus, wherein the first subchannel command and address information and the second subchannel command and address information are received in parallel.

3. The apparatus of claim 2, wherein the first register clock driver comprises:
a first driver circuit and a second driver circuit; and
a tee coupled to the first driver circuit and the second driver circuit, the tee is configured to provide the first subchannel command and address information to the first driver circuit and the second driver circuit,
wherein the first driver circuit and the second driver circuit are each configured to receive the first subchannel command and address information in parallel from the command and address bus via the tee.

4. The apparatus of claim 3, wherein the first driver circuit is configured to drive the first subchannel command and address information responsive to the clock signal to a first plurality of buses and the second driver circuit is configured to drive the first subchannel command and address information responsive to the clock signal to a second plurality of buses.

5. The apparatus of claim 1, wherein the first register clock driver comprises a clock signal circuit configured to receive the clock signal.

6. The apparatus of claim 1, further comprising:
a first memory coupled to the first register clock driver, the first memory is configured to receive write data from and provide read data to a memory controller.

7. The apparatus of claim 6, wherein the first memory is divided into a plurality of subsets, wherein each subset is coupled to a respective bus.

8. The apparatus of claim 1, wherein the clock signal splitter circuit comprises a first leg to receive the clock signal from an external bus, a second leg to route the clock signal to the first register clock driver, and a third leg to route the clock signal to the second register clock driver.

9. The apparatus of claim 1, wherein the clock signal splitter circuit is configured to maintain synchronous timing by implementing physical characteristics, the physical characteristics comprises impedance matching, matching trace length, selecting trace widths, use of passive resistors, and combinations thereof.

10. A method comprising:
receiving, at a clock signal splitter circuit of a memory subsystem, a clock signal via a first trace; and
routing the clock signal to a first registered clock driver of the memory subsystem via a second trace and a second registered clock driver of the memory subsystem via a third trace contemporaneously, wherein the second trace and the third trace are parallel.

11. The method of claim 10, further comprising:
routing a first subchannel command and address information from first command and address bus to the first registered clock driver; and
routing a second subchannel command and address information from second command and address bus to the second registered clock driver.

12. The method of claim 11, further comprising
splitting the first subchannel command and address information;
providing, contemporaneously, the split first subchannel command and address information to a plurality of driver circuits of the first registered clock driver.

13. The method of claim 11, further comprising:
driving the first subchannel command and address information to a first plurality of buses coupled to a first memory responsive to the clock signal; and
driving the second subchannel command and address information to a second plurality of buses coupled to a second memory responsive to the clock signal.

14. The method of claim 13, further comprising:
receiving the first subchannel command and address information at each subset of the first memory, wherein each subset of the first memory is coupled to a respective one of the first plurality of buses; and
receiving the second subchannel command and address information at each subset of the second memory, wherein each subset of the second memory is coupled to a respective one of the second plurality of buses.

15. The method of claim 10, further comprising:
receiving write data from a memory controller; and
providing read data to the memory controller.

16. The method of claim 10, wherein the first trace includes a first impedance, and wherein the second trace and the third trace include a second impedance and a first resistance.

17. An apparatus comprising:
a printed circuit board comprising a first set of traces coupled to a first command and address bus and a second set of traces coupled to a second command and address bus, wherein the printed circuit board further comprises a clock signal splitter circuit configured to receive the clock signal via a first leg and to contemporaneously route the clock signal via a second leg and a third leg that is connected in parallel with the second leg;
a first register clock driver circuit configured to receive the clock signal from the second leg and first command and address information from the first command and address bus, wherein the first register clock driver circuit is further configured to provide the first subchannel command and address information responsive to the clock signal;

a second register clock driver circuit configured to receive the clock signal from the third leg and second command and address information from the second command and address bus, wherein the second register clock driver circuit is further configured to provide the second subchannel command and address information responsive to the clock signal.

18. The apparatus of claim 17, further comprising:

a first memory coupled to the first register clock driver circuit via a first internal command and address bus, the first memory comprising a first die stack and a second die stack that each includes memory die stacked in a cascade stacked arrangement; and a first plurality of wire bonds coupled to the first and second die stacks.

19. The apparatus of claim 18, further comprising:

a second memory coupled to the second register clock driver circuit via a second internal command and address bus, the second memory comprising a third die stack with memory die stacked in a cascade stacked arrangement;

a second plurality of wire bonds coupled to the third die stack.

20. The apparatus of claim 19, wherein a number of memory die in the first die stack is less than a number of memory die in the third die stack.

* * * * *